United States Patent
Voß

(10) Patent No.: US 9,989,594 B2
(45) Date of Patent: Jun. 5, 2018

(54) MONITORING CIRCUIT FOR DETECTING A SWITCHING STATE OF AN ELECTRICAL SWITCHING CONTACT AND METHOD THEREFOR

(71) Applicant: WAGO Verwaltungsgesellschaft mbH, Minden (DE)

(72) Inventor: Christian Voß, Minden (DE)

(73) Assignee: WAGO VERWALTUNGESELLSCHAFT MBH, Minden (DE)

( * ) Notice: Subject to any disclaimer, the term of this patent is extended or adjusted under 35 U.S.C. 154(b) by 246 days.

(21) Appl. No.: 14/900,387

(22) PCT Filed: Jun. 18, 2014

(86) PCT No.: PCT/EP2014/062817
§ 371 (c)(1),
(2) Date: Dec. 21, 2015

(87) PCT Pub. No.: WO2014/202660
PCT Pub. Date: Dec. 24, 2014

(65) Prior Publication Data
US 2016/0146889 A1    May 26, 2016

(30) Foreign Application Priority Data
Jun. 21, 2013    (DE) .......... 10 2013 106 487

(51) Int. Cl.
*G01R 31/27* (2006.01)
*G01R 31/327* (2006.01)
(Continued)

(52) U.S. Cl.
CPC ............ *G01R 31/327* (2013.01); *H01H 9/16* (2013.01); *H03K 17/18* (2013.01); *H01H 1/0015* (2013.01)

(58) Field of Classification Search
CPC .. G01R 31/32; G01R 31/327; G01R 31/3278; H01H 9/16; H03K 17/18
See application file for complete search history.

(56) References Cited

U.S. PATENT DOCUMENTS

| | | | |
|---|---|---|---|
| 7,672,109 B2 | 3/2010 | Nitsche et al. | |
| 2003/0090257 A1* | 5/2003 | Howes | G01R 31/2601 324/127 |
| 2010/0082268 A1 | 4/2010 | Fischer | |

FOREIGN PATENT DOCUMENTS

| | | |
|---|---|---|
| CN | 101180698 A | 5/2008 |
| CN | 101685137 A | 3/2010 |

(Continued)

OTHER PUBLICATIONS

International Search Report dated Sep. 18, 2014 for International Application No. PCT/EP2014/062817 and English translation thereof.

(Continued)

*Primary Examiner* — Son Le
(74) *Attorney, Agent, or Firm* — Renner Otto Boisselle and Sklar

(57) ABSTRACT

The invention relates to a circuit (1) for detecting a switching state of an electrical switching contact (2) in a current supply path (5) for at least one electrical load (3). The monitoring circuit (1) has a monitoring unit (8) and a transformer (9). The transformer has a primary winding (10) connected to the monitoring unit (8) and a secondary winding (11) connected to the electrical switching contact (2). The secondary winding (11) forms a monitoring current circuit (6) together with the electrical switching contact (2) electrically connected to the secondary winding. The monitoring unit (8) is designed to apply electrical power to the primary winding (10) and to determine the switching state of the electrical switching contact (2) in dependence on a (Continued)

measured value ($U_A$) proportional to the current ($I_A$) flowing through the primary winding (10).

9 Claims, 1 Drawing Sheet

(51) Int. Cl.
    *H01H 9/16*     (2006.01)
    *H03K 17/18*     (2006.01)
    *H01H 1/00*     (2006.01)

(56) References Cited

FOREIGN PATENT DOCUMENTS

| | | |
|---|---|---|
| CN | 201448909 U | 5/2010 |
| DE | 28 06 294 | 8/1978 |
| DE | 100 11 211 | 9/2001 |
| EP | 1 453 072 | 9/2004 |
| EP | 2169700 A1 | 3/2010 |
| EP | 1 861 860 | 5/2010 |
| FR | 2632138 A * | 5/1988 |
| FR | 2 632 138 | 12/1989 |

OTHER PUBLICATIONS

Office Action and English translation for corresponding Chinese Patent Application No. 201480035302.0 dated Nov. 10, 2017.

* cited by examiner

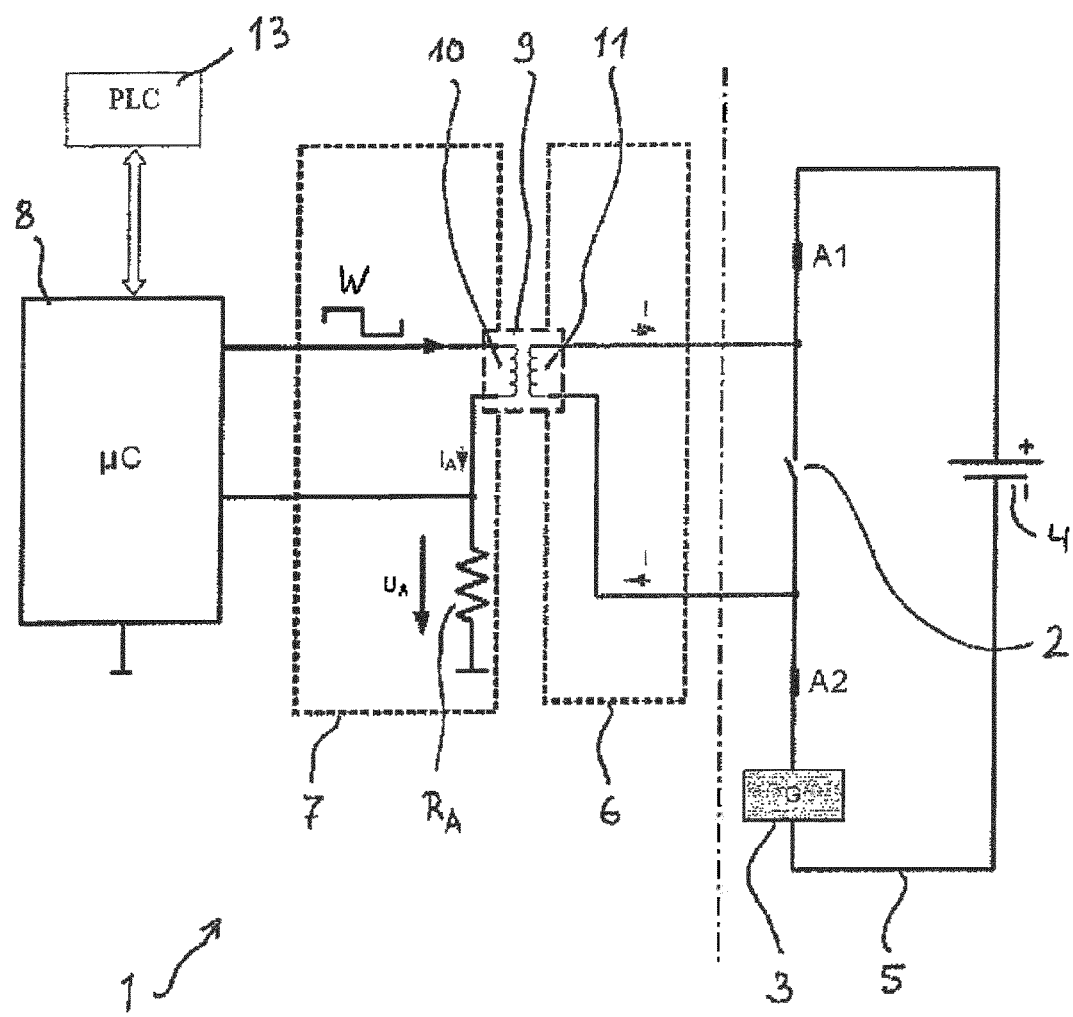

MONITORING CIRCUIT FOR DETECTING A SWITCHING STATE OF AN ELECTRICAL SWITCHING CONTACT AND METHOD THEREFOR

This application is a national phase of International Application No. PCT/EP2014/062817 filed Jun. 18, 2014.

The invention relates to a monitoring circuit for detecting a switching state of an electrical switching contact in a current supply path for at least one electrical load, whereby the monitoring circuit comprises a monitoring unit.

The invention further relates to a method for detecting a switching state of an electrical switching contact in a current supply path for at least one electrical load.

In safety switching devices it is necessary to determine the state of electrical switches to detect contact faults, like particularly a welding of the contacts. The term switching state of an electrical switch (electrical switching contact) describes whether the switching contacts are open or closed. But also the contact transition resistance of the switching contacts is interpreted in the broadest sense as switching state.

Usually positively driven relays are used for the realization of safe switches, to detect a contact fault by means of the feedback contacts of the positively driven relays. This is for example described in DE 100 11 211 A1.

EP 1 453 072 B1 discloses a method for monitoring an electrical contact that is included in a load circuit and a monitoring circuit. Hereby a separate voltage is supplied by means of an opto-electronic coupler. The detection device is connected in parallel to the separate voltage supply, which is again bypassed by the switching contact that is to be monitored. By aging, temperature and tolerances of the components of the opto-electronic couplers the problem is caused that the power for monitoring the electrical contact may be not sufficient.

EP 1 861 860 B1 describes a safety switching device for safe switching off an electrical load by means of a change-over contact of a standard relay, that switches a first switching path to a load and a second switching path to a monitoring circuit. Based hereon it is the problem of the present invention to provide an advanced monitoring circuit for detecting a switching state of an electrical contact in a current supply path for at least one electrical load as well as an advanced method for detecting a switching state of an electrical switching contact.

The problem is solved by the monitoring circuit with the features of claim 1 as well as by the method with the features of claim 6. Preferred embodiments are described in the dependent claims.

For a generic monitoring circuit it is suggested, that the monitoring circuit comprises a transformer with a primary winding, which is connected to the monitoring unit, and a secondary winding, which is connected to the electrical switching contact, whereby the secondary winding forms a monitoring current circuit together with the therein electrically connected electrical switching contact. The monitoring unit is thereby adapted to apply electrical power to the primary winding and to determine the switching state of the electrical switching contact in dependence on a measured value that is proportional to the current flowing through the primary winding.

Hence an inductive separation of the monitoring circuit from a control- and restore circuit is suggested. A closing of the at least one monitored electrical contact leads to a current flow in the monitoring current circuit, whereby power flowing across the primary winding is detracted from the control- and restore circuit to the secondary circuit. Thus the switching state of the electrical contact can be determined in dependence on a current flowing through the primary winding.

A transformer is known as an appropriate component, which provides a galvanic separation of a primary and secondary circuit and an inductive power transmission from primary winding to secondary winding follows. The primary winding is galvanically separated from the secondary winding. Primary and secondary winding are coupled electromagnetically with each other for example by winding onto a common carrier, as for example a ferrite rod or iron core for forming a magnetic circuit.

The acquisition of a measure value that is proportional to a current flowing through the primary winding is preferably carried out thereby that the primary winding is connected to a shunt resistor. The monitoring unit is then adapted for the acquisition of the voltage drop across the shunt resistor, which is the measure value that is proportional to the current flowing through the primary winding and the shunt resistor.

The shunt resistor is thereby preferably connected in series with the primary winding, so that the current flowing through the primary winding corresponds to the current flowing through the shunt resistor.

The monitoring unit is preferably adapted for the generation of an alternating voltage signal that is applicable to the primary winding of the transformer. Thereby it might be about a sinusoidal alternating voltage signal or about an otherwise formed alternating voltage signal, as for example a rectangular, triangular or otherwise alternating signal.

The monitoring circuit can for example be integrated in a control unit of an automation system. Thereby the compact and safe monitoring of switching contacts can be managed in an easy manner, without providing separate monitoring modules.

It is particularly preferred, if the monitoring unit comprises a field bus interface for the transmission of the switching state to a programmable controller of an automation system. Thereby not only the monitoring result can be reported locally and control measures can be made, if necessary. In fact, a monitoring and warning massage can be transmitted to a higher-ranked controller by means of the connection of the monitoring unit to a field bus interface. The controller then initiates appropriate measures also for complex facilities.

The problem is solved further by a method for detecting a switching state of an electrical switching contact by means of the step of the electromagnetic coupling of power from an evaluation circuit of a monitoring unit into a monitoring current circuit, that is galvanically separated from the evaluation circuit, which is connected to the electrical switching contact to be monitored, and determining the switching contact in dependence of the amount of power receivable by the monitoring current circuit. Preferably an acquisition of a voltage drop across a shunt resistor is carried out by means of a threshold switch. An open switching contact is detected, if the voltage is below a predetermined threshold. This threshold depends on the precise dimensioning of the monitoring circuit and can be determined and defined empirically. Thereby an easy and reliable monitoring logic can be managed with marginal effort.

It is however particularly preferred, if a detecting of a change of the contact resistance is carried out. Hereby an acquisition of the change of the power received by the monitoring current circuit during comparable switching state over the time is carried out. That way, the contact resistance changes over the operating time during an open or closed switching contact respectively and with it the power dispensed from the primary side to the monitoring current circuit. From the slow changes of the measure value over the operating time via the current flowing proportionally through the primary winding, a measure can be determined for the wear of the at least one contact to be monitored.

The invention is subsequently described in more detail by means of the attached figures and by means of an exemplary embodiment. It shows:

FIG. 1 a circuit diagram of a monitoring circuit for detecting of a switching state of an electrical switching contact.

FIG. 1 shows a circuit diagram of a monitoring circuit 1, which is adapted for detecting a switching state of a monitored switching contact 2. The electrical switching contact 2 is used for switching the energy supply of a device 3. The device 3 is connected with an energy supply 4 and, as the case may be, with further components as for example current limiting resistors A1 and/or fuses A2 in a load current circuit 5. The electrical switching contact 2 closes the load current circuit 5 as well as a monitoring current circuit 6.

For monitoring the switching state of the monitored electrical switching contact 2 in the load current circuit 5, a control and restore circuit 7 is provided, which is applied with an alternating signal W from a monitoring unit 8, as for example in form of a microcontroller ASICs, FPGA or a programmable logic control. The control and restore circuit 7 is coupled with the monitoring current circuit 6 via a transformer 9 under galvanic separation. The alternating signal W generated by the monitoring unit 8 is thereby supplied to the primary winding 10 of the transformer 9. The secondary winding 11 of the transformer 9 is connected with the electrical switching contact 2 to be monitored in the monitoring current circuit 6. It is apparent that the electrical switching contact 2 is, so to speak, switched in parallel to the secondary winding 11 and forms electrically a connection in series with the secondary winding 11 in the monitoring current circuit. If the electrical switching contact 2 is open, then the monitoring current circuit 6 as well as the load current circuit 5 are interrupted. In this case, the transformer 9 is operated in an open loop and thus requires only a small amount of energy and hence mandatory a small amount of transformer current $I_A$, which flows through the primary winding 10 and shunt resistor $R_A$ that is connected to it in series. Via this shunt resistor $R_A$, a voltage $U_A$ drops due to the transformer current $I_A$. This voltage $U_A$ is proportionally dependent on the transformer current $I_A$.

If the electrical switching contact 2 is closed, not only the load current circuit 5 is closed, but also the monitoring current circuit 6. A monitoring current I is then flowing through this monitoring current circuit 6 that is supplied by the transformer 9. This current flow I detracts energy from the transformer 9, whereby the transformer current $I_A$ in the control and restore circuit 7 increases. The transformer 9 is then not operated in an open loop anymore, but loaded.

Due to the increase of the transformer current $I_A$ during a closed electrical switching contact 2, the voltage $U_A$ across the shunt resistor $R_A$ increases.

Thereby, the voltage drop $U_A$ across the shunt resistor $R_A$ is a measurement value that is proportional to the current $I_A$ which is flowing through the primary winding, which is at the same time a measure for the switching state of the monitored electrical switching contact 2 in the monitoring current circuit 6.

The monitoring unit 8 has a separate or integrated measurement unit, for example in form of an analog/digital converter by which the voltage drop $U_A$ across the shunt resistor $R_A$ is measured. However, it is also conceivable that the monitoring unit 8 comprises a threshold switch that switches into a different switching state in case of an excess of a predetermined threshold voltage by the voltage drop $U_A$ across the shunt resistor $R_A$.

By determination of the voltage drop $U_A$ across the shunt resistor $R_A$ or, as the case may be, by detection of a boundary excess of this voltage $U_A$ a conclusion can be drawn regarding the state of the monitored electrical switching contact 2.

During the conversion of the analog voltage value $U_A$ which drops across the shunt resistor $R_A$ and which is proportional to the transformation current $I_A$, a differentiated evaluation can be carried out. Thereby, the monitoring unit 8 can provide, for example by means of an appropriate programming by software or in form of a hardware solution, different thresholds to monitor the contact resistance of the electrical switching contact 2 in this manner. However, it is also conceivable that only one threshold is monitored, by which it is possible to reliably detect whether the electrical switching contact 2 is open or closed. This can be carried out alternatively to an analog-digital converter via a Schmitt trigger with hysteresis.

It is also possible to perform a long-term monitoring of the voltage drop $U_A$ across the shunt resistor $R_A$ during the known switching state. If the contact transformation resistors of the monitored electrical switching contact 2 change over time, an increased contact resistance can lead to a decreasing monitoring current I and thus also a decreasing transformation current $PI_A$. Consequently, by an observation of the voltage $U_A$ across the shunt resistor $R_A$ over a longer operating time, a measure for the wear of the electrical switching contact 2 can be determined.

As a result of the evaluation of the voltage drop $U_A$ across the shunt resistor $R_A$ by the use of one or more thresholds and, as the case may be, by use of the long-term evaluation, an appropriate measure can be carried out by the monitoring unit 8. Thereby, the determined switching state can be signalized for example via an appropriate connection to a higher-ranked control unit via a field bus by wire or wireless. The monitoring unit 8 or a higher-ranked control unit can initiate further measures accordingly. Such measures can include for example the switching off of the relay comprising the electrical switching contact 2 or the output of a warning message for the replacement of the switch/relay.

By means of the simple magnetic coupling, a simple monitoring of electrical switching contacts with low effort is feasible by means of a galvanic separation of the load current circuit 5 from the evaluation and restore circuit 7. Expensive and positively driven relays that have been used until now can be replaced by simpler relays with the suggested monitoring circuit 1.

The invention claimed is:

1. A monitoring circuit for detecting a switching state of an electrical switching contact and a change of contact resistance in a current supply path for at least one electrical load, whereby the monitoring circuit comprises a monitoring unit, wherein the monitoring circuit comprises a transformer, that has a primary winding, which is connected to the monitoring unit, and has a secondary winding, which is connected to the electrical switching contact, wherein the secondary winding forms a monitoring current circuit together with the thereby electrically connected electrical switching contact, wherein the monitoring unit is adapted to apply electrical power to the primary winding and to determine the switching state of the electrical switching contact in dependence on a measured value that is proportional to the current flowing through the primary winding, and the monitoring unit is further adapted to determine a change of a contact resistance of the electrical switching contact over a time period by detection of a change of energy received by the monitoring current circuit during closed switching states of the electrical switching contact over the time period.

2. The monitoring circuit according to claim 1, wherein the primary winding is connected to a shunt resistor and the monitoring unit is adopted for the acquisition of a voltage drop across the shunt resistor, as the measurement value that is proportional to the current flowing through the primary winding and the shunt resistor.

3. The monitoring circuit according to claim 1, wherein the monitoring unit is adopted for the generation of an alternating voltage signal, that is applicable to the primary winding of the transformer.

4. The monitoring circuit according to claim 1, wherein the monitoring circuit is integrated into a control unit of an automation system.

5. The monitoring circuit according to claim 1, wherein the monitoring unit comprises a field bus interface for the transmission of the switching state to a programmable controller of an automation system.

6. A method for detecting a switching state of an electrical switching contact in a current supply path for at least one electrical load, wherein a monitoring unit is connected to the electric switching contact, the method comprising:

electromagnetically coupling energy from an evaluation circuit of the monitoring unit into a monitoring current circuit, the monitoring current circuit being galvanically separated from the evaluation circuit;

determining, by the monitoring current circuit, the switching state of the electrical switching contact in dependence on the amount of energy received by the monitoring current circuit, and determining a change of a contact resistance of an electrical switching contact over a time period by using the monitoring unit to detect a change of energy received by the monitoring current circuit during closed switching states of the electrical switching contact over the time period.

7. The method according to claim 6, wherein supplying an alternating voltage to the primary winding of a transformer, whose secondary winding, for the generation of the monitoring current circuit, is connected in parallel to the electrical switching contact, acquiring the current flowing through the primary winding as a measure for the energy received by the monitoring current circuit and detecting a closed switching contact, if the measured current is higher than in case of an open switching contact.

8. The method according to claim 7, wherein acquiring a voltage drop across a shunt resistor that is connected in series with the primary winding, as a measure for the current flowing though the primary winding and the shunt resistor and the energy received by the monitoring current circuit.

9. The method according to claim 6, wherein acquiring a voltage drop across a shunt resistor by means of a threshold switch and determining an open switching contact, if the voltage is below a predetermined threshold.

* * * * *